(12) United States Patent
Wallace

(10) Patent No.: US 8,538,353 B2
(45) Date of Patent: Sep. 17, 2013

(54) ADAPTIVE AVERAGE POWER TRACKING

(75) Inventor: Raymond C. Wallace, El Cajon, CA (US)

(73) Assignee: QUALCOMM Incorporated, San Diego, CA (US)

(*) Notice: Subject to any disclaimer, the term of this patent is extended or adjusted under 35 U.S.C. 154(b) by 146 days.

(21) Appl. No.: 13/031,027

(22) Filed: Feb. 18, 2011

(65) Prior Publication Data

US 2012/0214423 A1 Aug. 23, 2012

(51) Int. Cl.
H04B 1/03 (2006.01)

(52) U.S. Cl.
USPC .................... 455/127.1; 455/251.1

(58) Field of Classification Search
USPC .......... 455/127.1, 127.2, 572, 522, 69, 251.1; 330/296, 285, 261
See application file for complete search history.

(56) References Cited

U.S. PATENT DOCUMENTS

| | | | | |
|---|---|---|---|---|
| 6,331,799 B1* | 12/2001 | Miyazawa | ................... | 327/538 |
| 6,903,608 B2* | 6/2005 | Whittaker et al. | ............ | 330/254 |
| 7,378,909 B2* | 5/2008 | Tomizawa | ................... | 330/285 |
| 7,427,897 B2* | 9/2008 | Hau et al. | ................... | 330/297 |
| 8,026,767 B2* | 9/2011 | Chen et al. | ................... | 330/296 |
| 2008/0280575 A1 | 11/2008 | Pesola | | |

FOREIGN PATENT DOCUMENTS

| | | |
|---|---|---|
| EP | 1237297 A2 | 9/2002 |
| GB | 2421373 A | 6/2006 |

OTHER PUBLICATIONS

International Search Report and Written Opinion—PCT/US2012/025732—ISA/EPO—Apr. 23, 2012.

* cited by examiner

*Primary Examiner* — Sonny Trinh
(74) *Attorney, Agent, or Firm* — Ramin Mobarhan

(57) ABSTRACT

Exemplary embodiments of the invention include a request received to change a TX output power setting or a frequency channel setting. In response, the requested TX output power setting is used to generate a TX output signal in the proper frequency channel. Handset circuitry makes OOB power measurements, the results of which are used to determine a VCC2 setting. The VCC2 setting is a setting that results in an MPS requirement just being met. The VCC2 setting is stored in association with the TX output power and frequency channel setting. The determined VCC2 setting is also used to set the VCC2 supply voltage for the power amplifier. Once set, VCC2 remains fixed until the next request. Each individual handset uses this Adaptive Average Power Tracking (AAPT) method, thereby reducing its VCC2 voltage during operation and conserving power. Because each handset uses AAPT, factory calibration to account for unit-to-unit variations in transmitter circuitry performance is avoided.

20 Claims, 18 Drawing Sheets

BATTERY DIRECT

BATTERY DIRECT

PA OPERATION ASSUMING A FIXED RF
POWER INTO THE PA (FOR ONE TX OUTPUT POWER SETTING)

ENVELOPE TRACKING

ENVELOPE TRACKING

ENVELOPE TRACKING

MOBILE COMMUNICATION DEVICE

FACTORY CALIBRATION AND LOADING OF
AAPT TABLE

AAPT TABLE

ADAPTIVE AVERAGE POWER TRACKING AND
PERIODICALLY UPDATE VALUES IN TABLE

ADAPTIVE AVERAGE POWER TRACKING

ADAPTIVE AVERAGE POWER TRACKING (FOR ONE TX OUTPUT POWER SETTING)

EACH DEVICE INDIVIDUALLY SELF-CALIBRATES
ITSELF AFTER MANUFACTURE

ADAPTIVE AVERAGE POWER TRACKING
(LEARNING EXAMPLE)

ADAPTIVE AVERAGE POWER TRACKING
(LOOK UP EXAMPLE)

ADAPTIVE AVERAGE POWER TRACKING

BACKGROUND INFORMATION

1. Technical Field

The present disclosure relates to Power Amplifiers (PAs) used in Radio Frequency (RF) transmitters.

2. Background Information

FIG. 1 (Prior Art) is a diagram of a typical cellular telephone handset 1. Handset 1 includes a Digital Baseband Processor Integrated Circuit (DBPIC) 2, a Radio Frequency (RF) transceiver Integrated Circuit (RFIC) 3, Power Management Integrated Circuit (PMIC) and support circuitry 4, a Switching Mode Power Supply (SMPS) 5, an external Power Amplifier integrated circuit 6 (PA), a duplexer 7, an antenna switch 8, an antenna 9, and a set of matching networks 10-12. RFIC 3 includes a transmitter portion 13, a receiver portion 14, a power detector portion 15, a set of control and interface registers 16-18, and a serial bus interface 19. DBPIC 2 includes a Digital-to-Analog Converter DAC 20 for supplying an analog signal to the transmitter portion 13, an Analog-to-Digital Converter (ADC) 21 for digitizing an analog signal received from the receiver portion 14, and a serial bus interface 22 for communicating via serial bus 23 with RFIC 3. In addition, DBPIC 2 includes a local bus mechanism 24, a processor 25, and an amount of memory 26.

External PA integrated circuit 6 is used to amplify an RF input signal received from the transmitter portion of RFIC 3, and to deliver an amplified version of the RF signal at an increased power level indirectly through circuitry 12, 7, and 8 to antenna 9. The handset can output an RF signal from the antenna at one of a set of "transmitter output power settings." A Base Station (BS) can send a request to the handset. The request instructs the handset either to increase its "TX output power setting" one increment or to decrease its "TX output power setting" one increment. There are two components to achieving such a TX output power. One is the amplitude of the RF signal as supplied to the input of the PA. The other is the power gain of the PA and the subsequent loss of the amplified RF signal through the matching network 12, duplexer 7, and switch 8. When the BS sends a request that the handset output at its maximum TX output power setting, then DBPIC 2 supplies an appropriate RF signal amplitude to the PA 6 and sets the gain of the PA using a two-bit COARSE GAIN CONTROL signal on conductors 27. The result is that the handset outputs the correct amount of TX output power to antenna 9.

FIG. 2 (Prior Art) is a diagram that shows a characteristic of a TX output signal as transmitted from the handset. The TX output signal of interest is the 1.2288 MHz wide portion 28A indicated in the diagram. When this RF signal is amplified by PA 6 and is transmitted from antenna 9, nonlinearities in the transmitter including PA nonlinearities cause undesired "Out-Of-Band" (OOB) power ("shoulders" or "spectral regrowth") to be transmitted along with the desired signal of interest. When a handset is made, it is required that the handset meet certain requirements referred to here as Minimum Performance Standards (MPS) requirements. These requirements include a first requirement that linearity of the transmitter be of a minimum linearity (that OOB power is below a certain power as compared to the power of the desired signal of interest). In the example of FIG. 2, there is a 30 kHz range 28B that is centered at a frequency that is 885 kHz below the 0.880 GHz center frequency of the desired signal. Similarly, there is a 30 kHz range 28C that is centered at a frequency that is 885 kHz above the 0.880 GHz center frequency of the desired signal. It is required that the OOB power in each of these two 30 kHz ranges 28B and 28C be −42 dB or less as compared to the power of the desired signal in band 28A. The MPS compliance requirements also include a second requirement that the handset output a specified amount of output power when it is set to output at its maximum "TX output power setting".

Many PA integrated circuits today have two supply voltage (VCC) terminals. VCC1 terminal 30 in FIG. 1 is a first such supply terminal. VCC2 terminal 31 in FIG. 1 is a second such supply terminal. In the configuration set forth in FIG. 1, the two terminals 30 and 31 are supplied with the same supply voltage VPH_PWR in what is referred to here as the "battery direct" configuration. Two VCC terminals are provided rather than one for reasons related to reducing interference and noise interactions between different parts of the circuitry within the PA integrated circuit.

FIG. 3 (Prior Art) is a simplified diagram that illustrates the battery direct configuration circuit of FIG. 1. As the amplitude of the RF output signal increases and decreases, the supply voltage supplied onto the VCC1 terminal 30 and the VCC2 terminal 31 of PA 6 remains fixed.

FIG. 4 (Prior Art) is a simplified waveform diagram that illustrates operation in the battery direct configuration. As indicated by waveform 32, the power of the TX output signal increases and decreases over time. The supply voltage supplied onto the VCC1 terminal 30 and onto the VCC2 terminal 31, however, remains fixed. Waveform 33 represents this fixed and regulated DC voltage VBATT.

FIG. 5 (Prior Art) is a simplified diagram that shows how changing VCC1 and VCC2 in this battery direct configuration affects TX output power and battery current drawn by the PA.

A PA integrated circuit typically has a characteristic in that if the PA is outputting a signal of a certain output power, then the supply voltage VCC2 supplied to the PA can often be reduced from its supply voltage maximum without substantially affecting PA performance (the supply voltage supplied onto VCC1 terminal 30 is held substantially constant). The current drawn by the PA remains fairly constant despite the falling supply voltage VCC2. A handset using the PA in this way will remain in "compliance" with the MPS requirements. But as the supply voltage VCC2 is decreased further and further, there comes a point where PA performance is significantly affected and eventually the handset fails to meet the MPS requirements. This point is in part determined by the amplitude of the signal being output by the PA. The voltage difference between the maximum of the amplitude of the output signal and the maximum supply voltage VCC2, multiplied by the supply current (the supply current is fairly constant for these high supply voltages), is power. This power is largely wasted in the PA in the form of heat. To conserve power in the handset, it would be desirable to be able to power the PA with the minimum supply voltage VCC2 so as to save power while maintaining MPS compliance.

FIG. 6 (Prior Art) is a diagram that shows how reducing supply voltage VCC2 has a minor impact on PA linearity 34 as the supply voltage VCC2 is reduced from 3.6 volts to about 2.6 volts, but as the supply voltage VCC2 is reduced further below 2.6 volts the PA linearity 34 decreases faster. PA TX output power 35 remains relatively constant over the entire 3.6 volt to 2.1 volt VCC2 supply voltage range.

Unfortunately, a duplexer does not have the same performance as the PA across the entire frequency range of operation (the BC0 band that has a bandwidth of 25 MHz is used in the following description). The drooping line 36 in FIG. 7 (Prior Art) represents PA gain in an individual handset. The duplexer has more insertion loss at the low end of the 25 MHz band and at the high end of the 25 MHz band as compared to the insertion loss in the middle of the band. The gain of the PA is therefore made to be larger at these ends of the band so that overall handset gain to the antenna is relatively constant across the band, regardless of where in the band the 1.2288 MHz RF signal to be transmitted is located. The 1.2288 MHz RF signal is made to move around in the 25 MHz band as the handset operates. There are discrete "frequency channels", whose center frequencies are separated from one another by 30 kHz. The 1.2288 MHz signal is transmitted in one of these frequency channels. 1.2288 MHz is much wider than 30 kHz, so two RF signals in adjacent frequency channels would overlap each other to some extent.

In addition to variations in the performance of one duplexer as a function of frequency, there are also variations in the components of the handset from unit to unit. Handsets are made in a factory by the millions, and it is too time consuming (and therefore too costly) to calibrate each handset unit on the factory line to test its linearity and output power characteristics for a certain VCC2 to assure compliance at the handset's maximum TX output power setting. As a result, all the handsets are made to use a higher VCC2 supply voltage setting than would ordinarily be necessary to achieve compliance in an individual handset just so that a few handset units that function relatively poorly will also be compliant.

In FIG. 7 (Prior Art), the vertical separation between the stair step VCC2 line 37 and the stair step VCC2 line 38 represents the extra margin of VCC2 that is provided. Note that in this possible solution, the VCC2 supply voltage is different depending on where in the 25 MHz band the 1.2288 MHz RF signal of interest lies. The VCC2 level of a particular handset is not typically reduced to the point of the handset unit just barely meeting linearity and output power requirements. The PA of the typical handset unit is supplied with a VCC2 supply voltage that is significantly higher than required by the typical unit.

FIG. 8 (Prior Art) is a circuit diagram of a second item of prior art referred to here as "envelope tracking" In addition to the circuitry of FIG. 1, the handset of FIG. 8 includes a high-speed switching mode power supply 39, a terminal 40, a special receiver portion 42, another ADC 43, and a conductor 44. Power supply 39 has the capability of changing VCC2 (not VCC1) very rapidly as the amplitude of the RF signal changes. Supply voltage VCC2 is not set at a fixed level for a given frequency channel and left at that level, where the VCC2 level of each frequency channel may be different. Rather, the VCC2 level is rapidly changed during handset transmission in one frequency channel, and this rapid variation is a function of power of the TX output signal. A digital control signal or signals CONTROL supplied via conductor or conductors 44 control the power supply 39 to vary the supply voltage VCC2 appropriately. Reference numeral 45 represents a splitter. Reference numeral 46 represents a 20 dB coupler.

FIG. 9 (Prior Art) is a simplified diagram of the envelope tracking configuration of FIG. 8. Supply voltage VCC1 supplied to onto VCC1 terminal 30 of the PA 6 is constant. The supply voltage VCC2 supplied onto VCC2 terminal 31, however, is made to vary as a function of the power of the I and Q components of the signal being amplified by the PA.

FIG. 10 (Prior Art) is a simplified diagram that illustrates operation of the envelope tracking configuration circuit of FIG. 8 and FIG. 9. Dark line 47 represents the supply voltage VCC2 supplied onto VCC2 terminal 31 of PA 6. Note that the amplitude of supply voltage VCC2 tracks the envelope of the TX output signal 48.

To realize envelope tracking, the special receiver 42 is provided to monitor the amplitude of the RF output signal. Coupler 46 supplies some of the RF output signal as output from the power amplifier 6 back to the special receiver. The output of the special receiver 42 is digitized and is then processed in DBPIC 2 to make a determination of the power amplitude of the time varying TX output signal. The resulting power determination is then used to adjust the level of supply voltage VCC2 output by Switching Mode Power Supply 39 to PA 6. DBPIC 2 controls the level of supply voltage VCC2 via control signal CONTROL on conductor or conductors 44. As illustrated in FIG. 10, the supply voltage VCC2 is not fixed for one combination of frequency channel setting and TX output power setting, but rather the supply voltage VCC2 closely tracks the magnitude of the amplitude of the TX output signal as illustrated in FIG. 10.

Although envelope tracking reduces power consumption of the transmitter circuitry, it can be difficult to adjust the VCC2 power supply voltage fast enough and accurately enough in certain situations. If not done correctly, there can be substantial distortion of the signal of interest, and receive band noise can be generated.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 11:
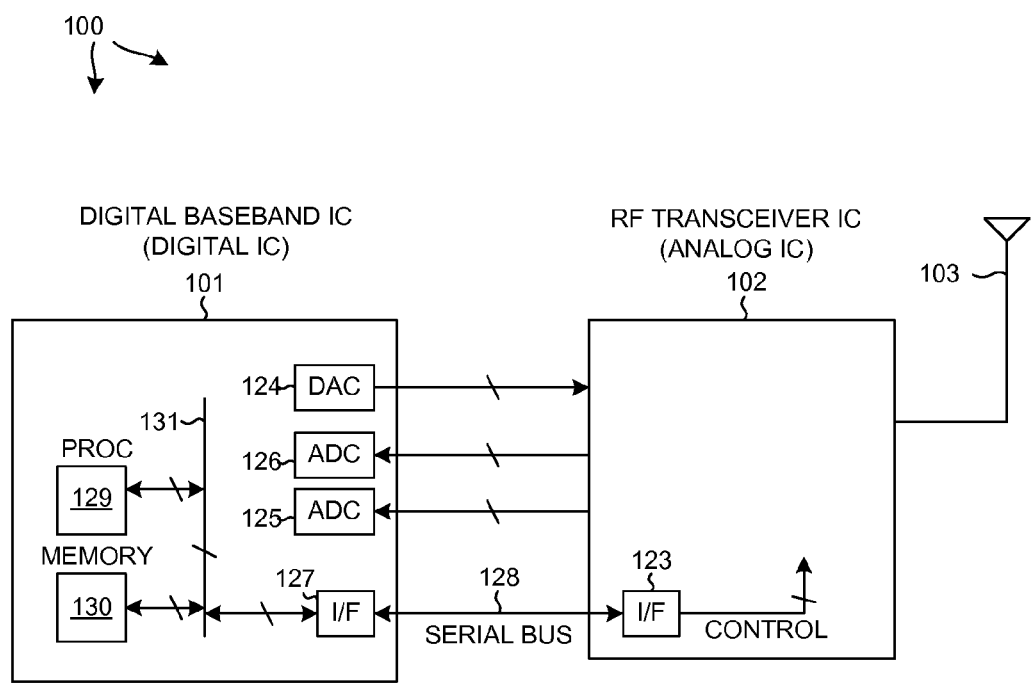
FIG. 11 is a high level diagram of a cellular telephone handset that carries out an Adaptive Average Power Tracking (AAPT) method in accordance with one novel aspect.

FIG. 11 is a high level diagram of a wireless mobile communication device 100 (for example, a cellular telephone handset) that carries out an Adaptive Average Power Tracking (AAPT) method as described below. Handset 100 includes (among other parts not illustrated) a Digital Baseband Processor Integrated Circuit (DBPIC) 101, a Radio Frequency (RF) transceiver Integrated Circuit (RFIC) 102, and an antenna 103.

Figure 12:
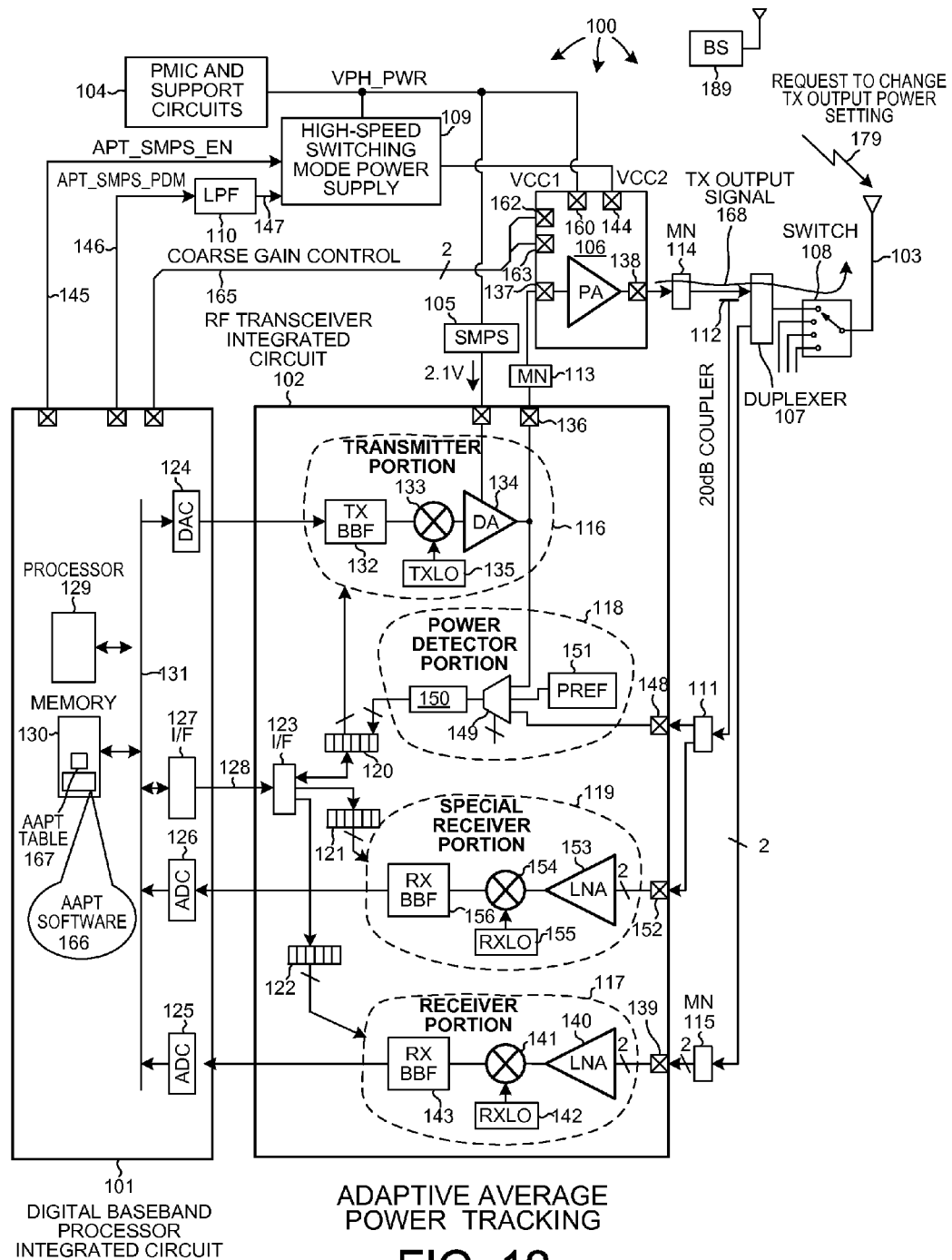
FIG. 12 is a more detailed diagram of the handset of FIG. 11.

FIG. 12 is a more detailed diagram of the handset 100 of FIG. 11. Handset 100 includes DBPIC 101, RFIC 102, antenna 103, Power Management Integrated Circuit (PMIC) and support circuitry 104, a Switching Mode Power Supply (SMPS) 105, an external Power Amplifier integrated circuit (PA) 106, a duplexer 107, an antenna switch 108, a high-speed programmable Switching Mode Power Supply (SMPS) 109, a Low Pass Filter (LPF) 110, a splitter 111, a 20 dB directional coupler 112, and a set of matching networks 113-115. RFIC 103 includes a transmitter portion 116, a receiver portion 117, a power detector portion 118, a special receiver portion 119, a set of control and interface registers 120-122, and a serial bus interface 123. DBPIC 101 includes a Digital-to-Analog Converter DAC 124 for supplying an analog signal to the transmitter portion 116, an Analog-to-Digital Converter (ADC) 125 for digitizing an analog signal received from the receiver portion 117, an ADC 126 for digitizing an analog signal received from the special receiver portion 119, a serial bus interface 127 for communicating via serial bus 128 with RFIC 102, a processor 129, an amount of memory 130, and a local bus mechanism 131. An amount of software, referred to as "Adaptive Average Power Tracking" (AAPT) software 166, is stored in memory 130 in DBPIC 101. When software 166 is executed by processor 129, the processor 129 controls the handset circuitry such that a AAPT method is carried out. As described further below, AAPT software 166 uses an associated AAPT table 167. AAPT 167 is stored in memory 130.

If the handset is to transmit a cellular telephone communication in ordinary fashion, then information to be transmitted is converted from digital form to analog form by DAC 124, is filtered by base band filter 132, and is upconverted by mixer 133, and is amplified by driver amplifier 134. The upconversion function carried out by mixer 133 is controlled by local oscillator 135. Local oscillator is in turn controlled by DBPIC 101 via the serial bus 128. The amplified analog signal output by driver amplifier 134 passes through terminal 136 and matching network 113 to the input terminal 137 of external PA integrated circuit 106. External PA integrated circuit 106 amplifies the signal and outputs it via terminal 138. The signal 168 then passes through matching network 114, and duplexer 107, and switch 108, so that it is transmitted from antenna 103.

If the handset is to receive a cellular telephone communication in ordinary fashion, then a signal received on antenna 103. The signal passes through switch 108, through duplexer 107, and through matching network 115, and through terminals 139, and to receiver portion 117. The signal is amplified by LNA 140, and is downconverted by mixer 141. The downconversion is controlled by local oscillator 142 that is in turn controlled by DBPIC 101 via serial bus 128. The downconverted signal is filtered by base band filter 143, and is then digitized by ADC 125 such that the resulting digital information is accessible to processor 129.

Processor 129 can disable the high-speed programmable SMPS 109 and thereby prevent SMPS 109 from supplying energy to PA 106 via VCC2 terminal 144. To disable SMPS 109, the processor 129 causes a digital control signal APT_SMPS_EN on conductor 145 to a digital low level. In this disabled state, power is not being supplied to PA 106 via VCC2 terminal 144. If the digital control signal APT_SMPS_EN on conductor 145 is a digital high level, then SMPS 109 is enabled and the magnitude of the VCC2 supply voltage supplied onto VCC2 terminal 144 is controlled by the pulse-density modulation digital signal APT_SMPS_PDM on conductor 146. LPF 110 averages the pulse train of the APT_SMPS_PDM signal and supplies a corresponding DC voltage via conductor 147 to SMPS 109. By varying the density of pulses on conductor 146, DBPIC 101 controls the magnitude of the VCC2 supply voltage. A higher pulse density results in a higher VCC2 supply voltage. A lower pulse density results in a lower VCC2 supply voltage.

Processor 129 can detect the power of a TX output signal using wideband power detector portion 118. A portion of the TX output signal 168 that is output from PA 106 is picked up by coupler 112. The term "TX output signal" here refers generally to the signal at all points between the output of the power amplifier in PA integrated circuit 106, through all the intervening circuitry, to antenna 103. Signal attenuation through components 114, 107 and 108 is disregarded. The portion of the TX output signal picked up by coupler 112 passes through splitter 111 and through terminal 148, through analog multiplexing functionality 149, and to power detector 150. Block 151 represents a power detector reference. Processor 129 can read the resulting digitized output of the power detector portion 118 by reading register 120 via serial bus 128 and the serial bus interface 123.

Processor 129 can measure Out-Of-Band (OOB) power using special receiver portion 119. A portion of a TX output signal 168 as output by PA 106 is picked up by coupler 112 as described above. This portion of the TX output signal passes through splitter 111, and through terminal 152. The signal is amplified by LNA 153, and is downconverted by mixer 154. How mixer 154 downconverts is controlled by DBPIC 101 via serial bus 128 and local oscillator 155. The resulting downconverted signal is filtered by base band filter 156, and is digitized by ADC 126 such that the resulting information in digital form is available to processor 129. Special receiver portion 119 is tuned to receive in a narrow band at the appropriate offset from the center frequency of the TX output signal 168 being transmitted so that the measurement of the special receiver is a measurement of out-of-band power. Digital filtering in the DBPIC 101 provides a 30 kHz wide narrow filtering of the resulting digitized information.

Figure 13:
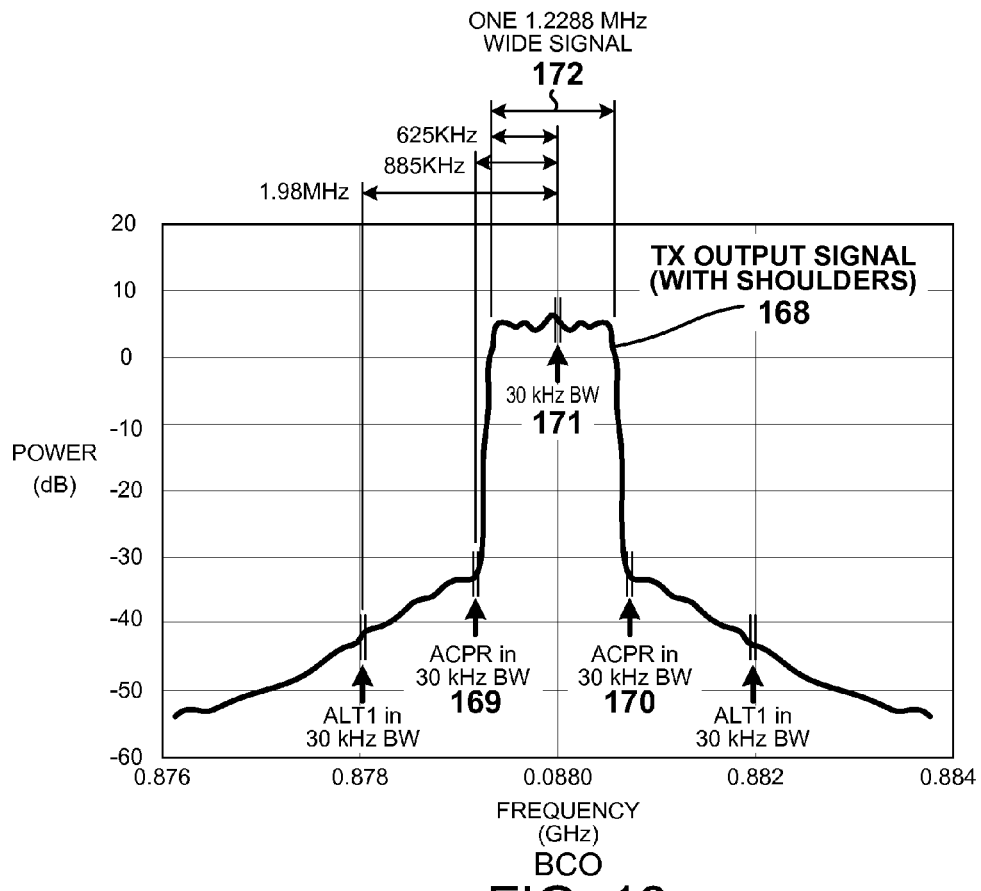
FIG. 13 is a diagram that illustrates a TX output signal as it is being transmitted from the antenna of the handset of FIG. 11.

FIG. 13 is a diagram that illustrates TX output signal 168 as it is being transmitted (in one representative frequency channel) from the antenna 103 of the handset 100 of FIG. 11. To measure linearity, the special receiver portion 119 is tuned to pick up OOB power in the shoulder relative to the 1.2288 MHz wide band 172 of the desired signal. In one example, a first measurement is made at a −885 kHz offset as indicated by reference numeral 169 and a second measurement is made at a +885 kHz offset as indicated by reference numeral 170. In addition, digital filtering in the baseband filter is used to make the receiver effectively only pick up energy in a narrow bandwidth (30 kHz wide as an example). In some examples, power detector portion 118 is not provided or used to measure TX output power, but rather the special receiver portion 119 is used to measure TX output power. In these examples, special receiver 119 measures TX output power by tuning the special receiver portion 119 to receive energy in the center of the 1.2288 MHz wide frequency channel of the TX output signal 168. Digital filtering may be performed in DBPIC 101 on the digitized output of DAC 126 so that the special receiver portion 119 effectively only picks up energy in the narrow 30 kHz wide center of the 1.2288 MHz signal. Reference numeral 171 in FIG. 13 indicates this 30 kHz wide band. The magnitude of the OOB measurement correlates in a known way to TX output power of the TX output signal 168.

Figure 6:
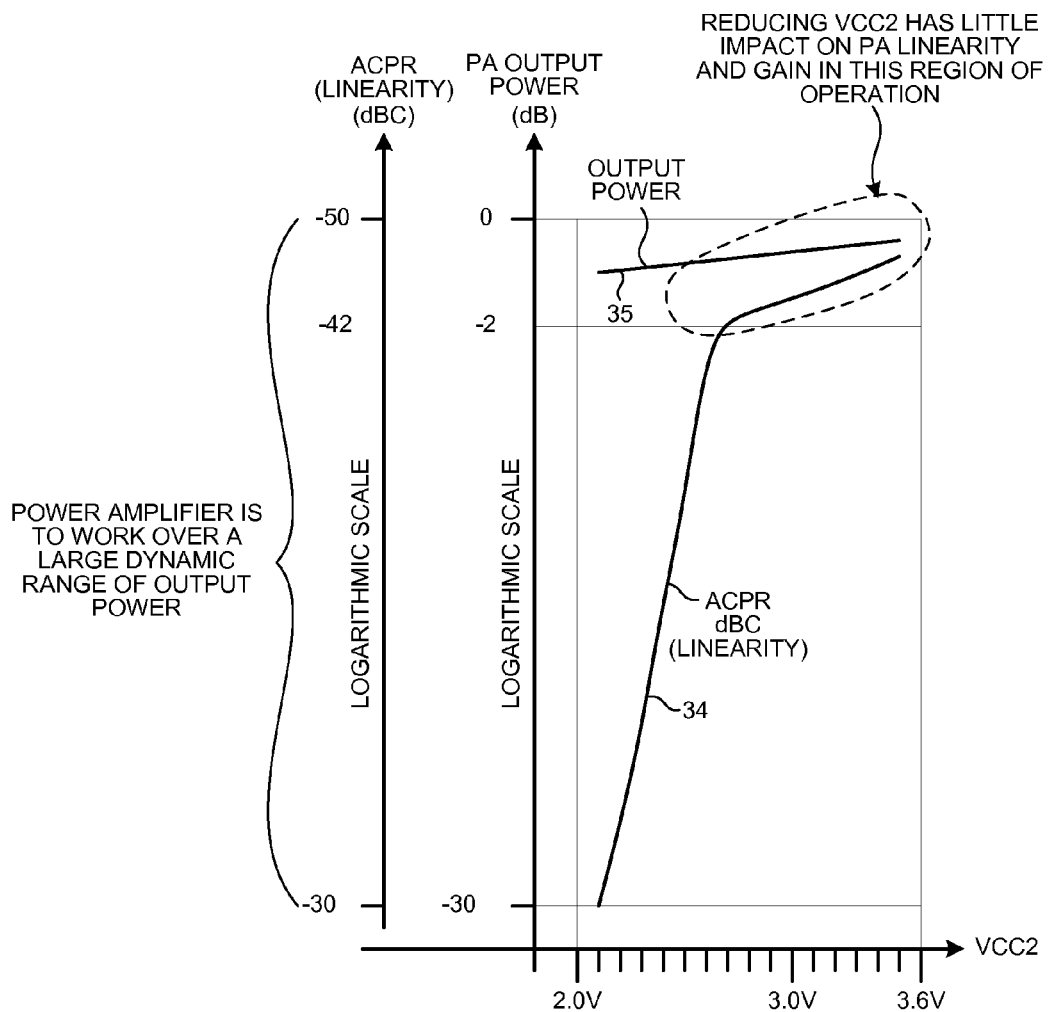
FIG. 6 (Prior Art) is a diagram that shows how reducing supply voltage VCC2 affects PA output power and PA linearity (for a fixed RF power being supplied into the PA).
Figure 14:
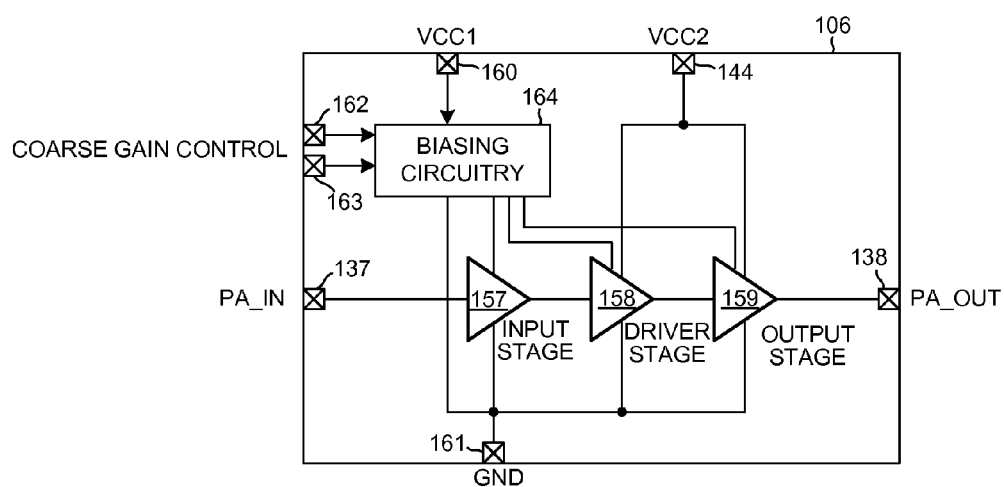
FIG. 14 is a more detailed diagram of the PA of the handset of FIG. 11.

FIG. 14 is a more detailed diagram of PA 106 of FIG. 12. PA 106 includes an input stage 157, a driver stage 158, an output stage 159, PA input terminal 137, PA output terminal 138, VCC2 supply terminal 144, VCC1 supply terminal 160, a ground terminal 161, two COARSE GAIN CONTROL terminals 162 and 163, and biasing circuitry 164 interconnected as illustrated. Processor 129 of the DBPIC 101 coarse tunes the gain of the PA 106 via digital control signal COARSE GAIN CONTROL received via conductors 165 and terminals 162 and 163. The first supply voltage VCC1 powers the biasing circuitry and powers the input stage. It is generally best to leave the VCC1 supply voltage unchanged because VCC1 supplies the bias circuitry of the PA and must be run at a constant voltage (typically 3.4V) for current commercially available PAs. The second supply voltage VCC2 is supplied to the driver amplifier stage 158 and the output stage 159. This VCC2 supply voltage can be decreased from its VCC2 maximum (for example, 3.6 volts) down to some lower VCC2 level while still maintaining system compliant performance as described above in connection with FIG. 6. The label "VCC2" denotes the second supply voltage that is supplied to the power amplifier and distinguishes this supply voltage from the first VCC1 supply voltage.

Figure 15:
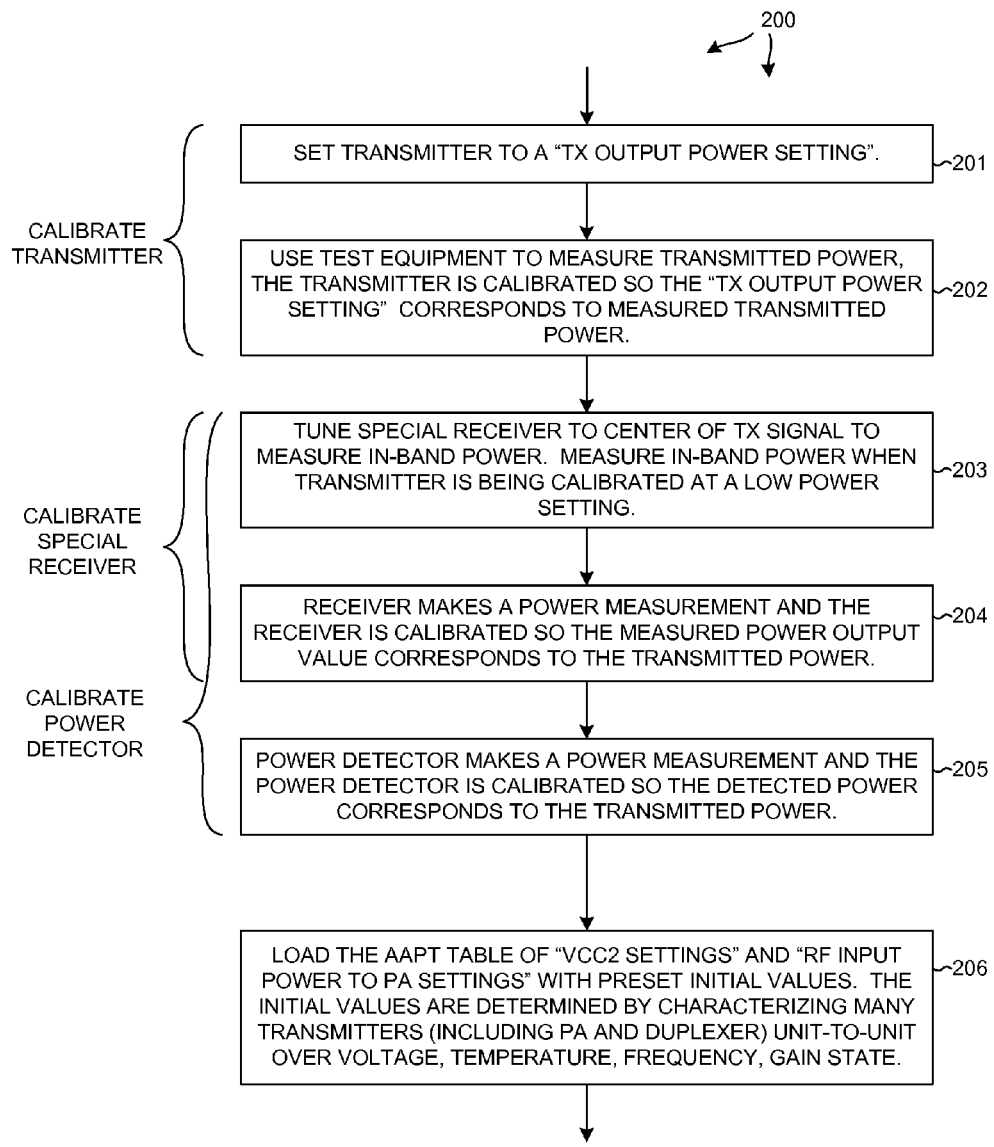
FIG. 15 is a simplified flowchart of a method of factory calibration and of loading of the AAPT table in the handset of FIG. 11.

FIG. 15 is a flowchart of a method 200 of factory calibration and of loading of the AAPT table 167 in cellular telephone handset 100. In a first step (step 201), the transmitter portion 116 is set by DBPIC 101 to output the TX output signal 168 to antenna 103 using a "TX output power setting". There are a number of such "TX output power settings", where each one of the TX output power settings corresponds to a different one of a corresponding set of discrete TX output powers. After the handset 100 is set to use this "TX output power setting", then calibrated test equipment on the factory assembly line is used to measure (step 202) the amount of power actually transmitted by handset 100. The test equipment then communicates the power measurement value back to processor 129. Processor 129 then associates the TX output power setting used with the actual power measurement value. Although not shown in FIG. 15, the handset is then set to transmit using a different one of the TX output power settings and the process is repeated. In this way, the actual amount of transmit power that will be transmitted from the handset is determined and recorded by processor 129 for each of the possible TX output power settings.

Next, the special receiver portion 119 is tuned to receive (step 203) at the center frequency of a TX output signal 168 being output by the transmitter portion 116 at a low power setting, where the actual amount of TX output power that corresponds to the low TX output power setting is known due to prior calibration. The special receiver portion 119 makes a power measurement (step 204) and the receiver output is calibrated so that the measured output power value determined from the special receiver matches the known amount of TX output power. At the same time, the power detector portion 118 also makes a power measurement (step 205) and the output of the power detector portion 118 is calibrated so that the detected power matches the known amount of TX output power. The transmitter portion 116, the special receiver portion 119, and the power detector portion 118 are therefore calibrated in the factory on the assembly line.

In addition, a set of "VCC2 settings" and "RF input power to PA settings" is loaded (step 206) into the handset to populate AAPT table 167 as explained in further detail below. For each combination of "TX output power setting" and "frequency channel", the table is loaded to contain a "VCC2 setting" and an "RF input power to PA setting". The initial values of these settings are determined by characterizing many transmitters (including the PA of the transmitter and the duplexer of the transmitter), unit-to-unit, over voltage, temperature, frequency and gain state. The "VCC2 setting" and "RF input power to PA setting" values chosen and loaded into AAPT table 167 are values that will result in substantially the entire population of handset units passing MPS requirements. The values chosen are not, however, generally the lowest VCC2 settings that may be permissible for a given handset.

Figure 16:
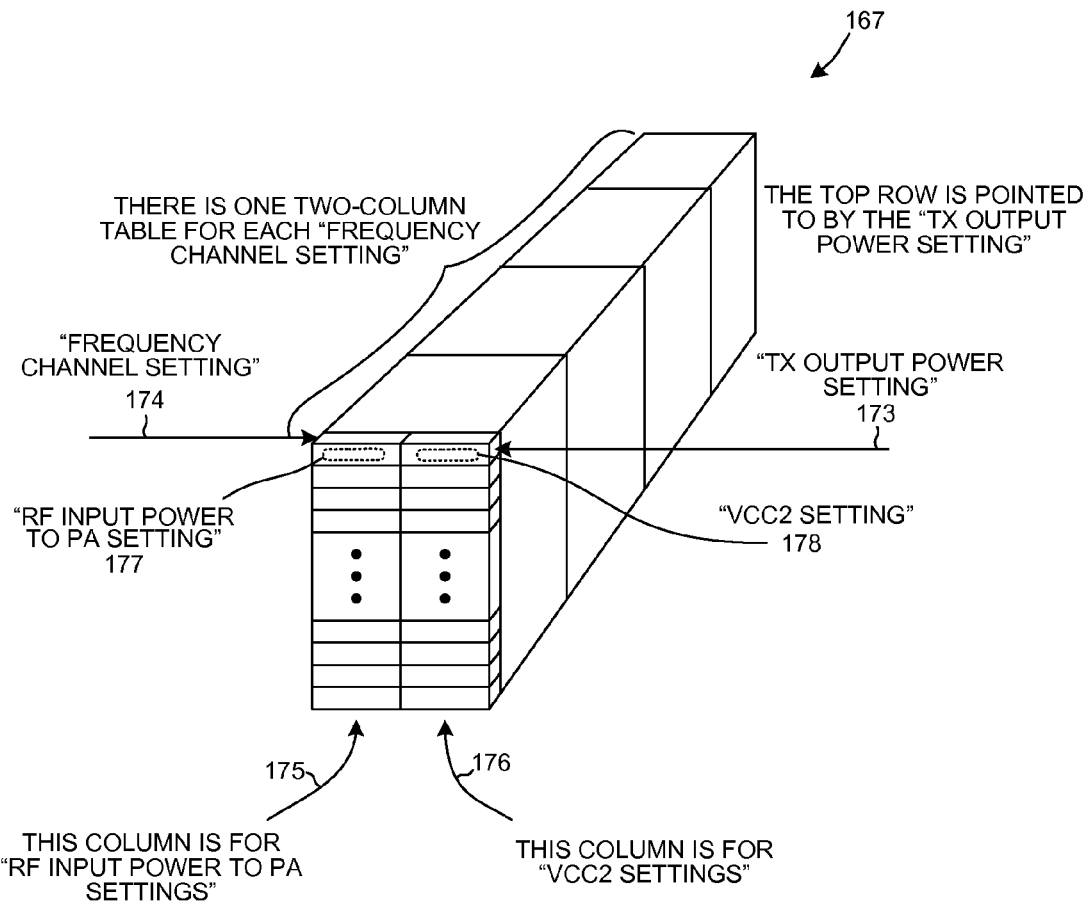
FIG. 16 is a perspective diagram (conceptual diagram) of the AAPT table.

FIG. 16 is a representation of the AAPT table 167 of information stored in memory 130 of the DBPIC 101 of FIG. 12. AAPT table 167 is used to perform a lookup function. For each input combination of "TX output power setting" and "frequency channel setting", the AAPT table 167 can be read to output a pair of values: 1) a "VCC2 setting", and 2) an "RF input power to PA setting". Arrow 173 represents the "TX output power setting" that points to one row of the AAPT table 167. There is one such two-column table for each frequency channel. In the illustration, the two-column tables are stacked so that the stack extends in a perspective view into the page. Arrow 174 represents the current "frequency channel setting" that points to one particular two-column table. In the illustrated example, it is the most forward two-column table that is pointed to by the current "frequency channel setting". Arrow 175 identifies the leftmost column of the identified two-column table. This leftmost column stores "RF input power to PA settings". Arrow 176 identifies the rightmost column of the identified two-column table. This rightmost column stores "VCC2 settings". For the particular incoming "TX output power setting" 173 and the particular incoming "frequency channel setting" 174 illustrated in FIG. 16, the looked up "RF input power to PA setting" is "RF input power to PA setting" 177 and the looked up "VCC2 setting" is "VCC setting" 178.

Figure 17A:
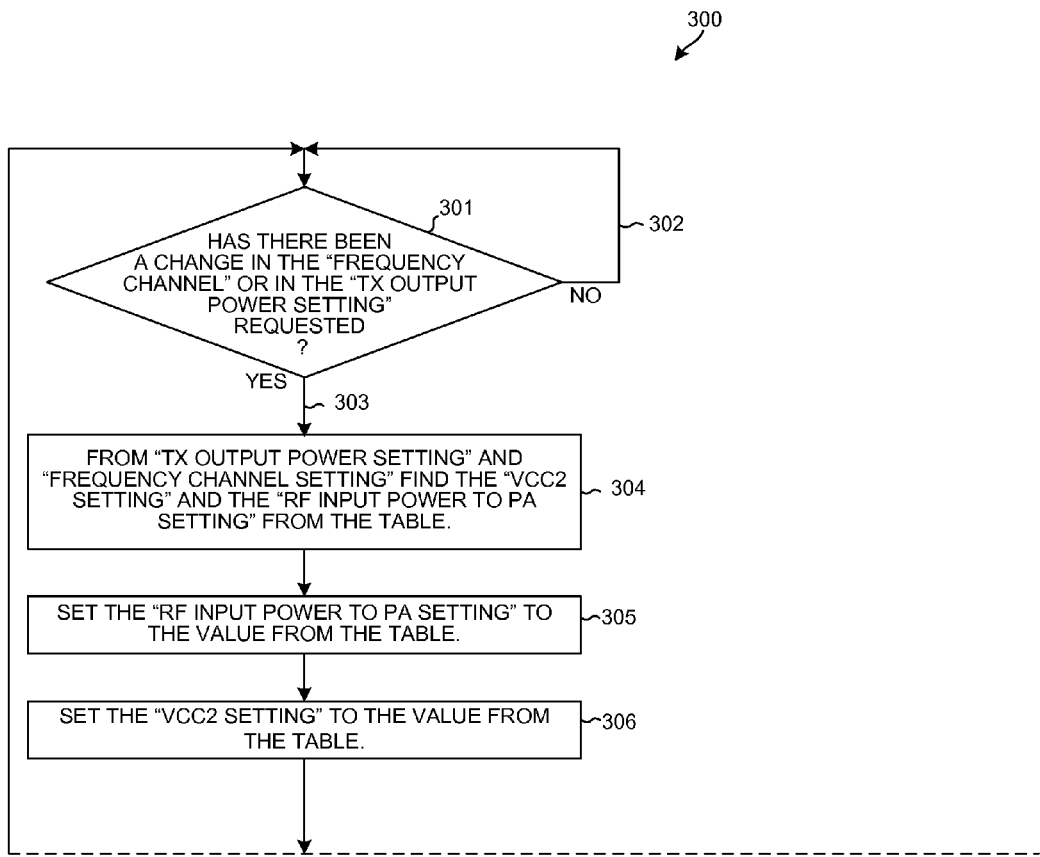
FIG. 17A and FIG. 17B is a flowchart of an AAPT method.
Figure 17B:
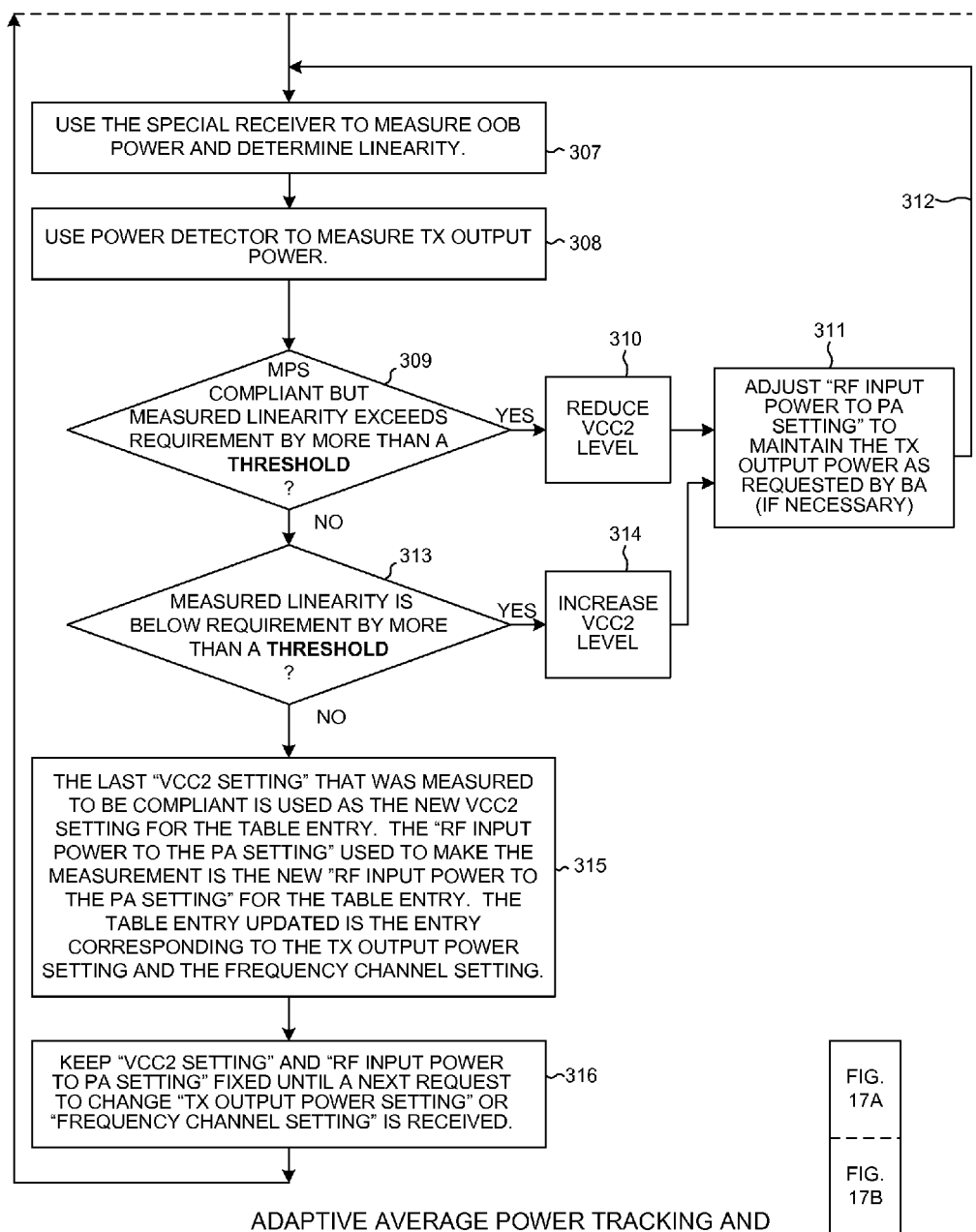

FIG. 17A and FIG. 17B is a flowchart of an AAPT method 300. Processor 129 executing AAPT software 166 determines (step 301) whether there has been a change in the "frequency channel setting" or in the "TX output power setting" requested. If there has been no change, then processing flow continuously loops back as indicated by arrow 302. If, however, there has been a change in the "frequency channel setting" or in the "TX output power setting" requested, then processing proceeds as indicated by arrow 303. The request to change frequency channel setting or TX output power setting may be a request 179 (see FIG. 12) that is received from a base station 189 as part of carrying out a closed loop power control algorithm. Typically a multi-bit wireless communication from the base station 189 includes a bit that is either set or is cleared. In one state, the bit indicates that the request is to increase the TX output power setting by one output power setting increment. The new TX output power setting is the setting that results in the next largest amount of TX output power. In the other state, the bit indicates that the request is to decrease the TX output power setting by one output power increment. The new TX output power setting is the setting that results in the next smallest amount of TX output power. A request to change the frequency channel setting may be included in the same multi-bit wireless communication from the base station 189. Although the change in frequency channel setting or TX output power setting can be due to a request received from a base station, in some examples the request is due to a condition on the handset. In such a case, the request is communicated from one portion of the handset to another. For example, a detected low temperature condition can be detected on the handset and can give rise to a request to reduce the TX output power setting, whereas a detected high temperature condition can be detected on the handset and can give rise to a request to increase the TX output power setting.

Next (step 304), the requested "frequency channel setting" and the requested "TX output power setting" are used to lookup a "VCC setting" and a "RF input power to PA setting" from AAPT table 167. The looked up "RF input power to PA setting" is then used (step 305) to set the signal power level supplied to PA 106. The looked up "VCC setting" is then used (step 306) to set the VCC2 supply voltage supplied to PA 106. The special receiver portion 119 is used (step 307) to measure OOB power and based on the measurement the processor makes a linearity determination. The power detector portion 118 is used (step 308) to measure TX output power.

Next (step 309), a determination is made as to whether the handset is MPS compliant in a condition in which the measured linearity exceeds a linearity requirement by more than a threshold amount. The threshold amount may, for example, be −37 dBM per 30 kHz absolute power with respect to the power level of the TX output signal of interest. If the handset is determined to be MPS compliant with a measured linearity that exceeds the linearity requirement by more than the threshold amount, then the VCC supply voltage is reduced (step 310) by reducing the VCC setting one increment. Because reducing the VCC supply voltage one increment may incidentally reduce the gain of the transmitter and therefore the TX output power, the "RF input power to PA setting" may be adjusted (step 311) to compensate if necessary. As indicated by arrow 312, processing returns to steps 307 and 308 where linearity and TX output power are measured when the handset is using the new VCC2 setting.

If, however, the determination is that the handset is not MPS compliant with a linearity that exceeds the threshold (step 309), then a determination is made (step 313) as to whether the measured linearity is below the MPS requirement by more than a threshold amount. The threshold amount may, for example, be −35 dBM per 30 kHz absolute power with respect to the power level of the TX output signal of interest. If the measured linearity is below this threshold, then the VCC supply voltage is increased (step 314) by incrementing the VCC2 setting to the next higher VCC2 setting level. The "RF input power to PA setting" is adjusted if necessary (step 311) to maintain a substantially constant TX output power. The linearity and TX output power is then measured in steps 307 and 308 for the new VCC2 setting.

If the measured linearity (step 313) is determined not to be below the required linearity by more than the threshold amount, then the measured linearity is in a predetermined range with respect to MPS requirements. In one example, the predetermined range is a range whose lowest linearity bound is only slightly better than the minimum linearity required for MPS compliance.

Next (step 315), the last VCC2 setting that was measured to be compliant is used as the new VCC2 setting that is loaded into AAPT table 167 at location in the table pointed to by the requested "TX output power setting" and the "frequency channel setting". Similarly, the "RF input power to PA setting" that was used to make the measurement is loaded into AAPT table 167 in association with the VCC setting.

Handset 100 then uses the "VCC2 setting" and the "RF input power to PA setting", and keeps these settings fixed (step 316) until a next request to change the "TX output power setting" or the "frequency channel setting" is received. If such a request is received, then processing returns to step 301. Each individual handset performs the AAPT method 300 as it operates in the field. If a particular handset unit in the field has a duplexer with superior signal injection characteristics, then that handset is made to operate with a lower TX output power setting as compared to another handset unit in the field that has a duplexer with inferior signal injection characteristics. The handset having the duplexer with inferior signal injection characteristics is operated with a higher TX output power setting (all other factors being equal) in order to satisfy linearity requirements.

Figure 18:
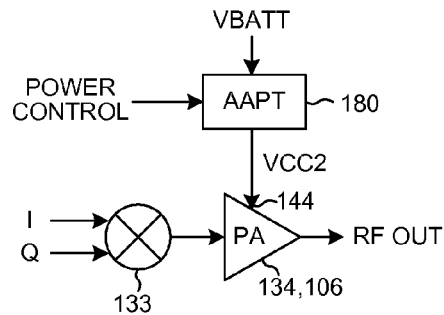
FIG. 18 is a simplified diagram of the AAPT circuit of FIG. 11.

FIG. 18 is a simplified diagram of the AAPT circuitry in handset 100. Block 180 represents all the circuitry of handset 100 that controls the VCC2 supply voltage including coupler 112, power detector portion 118, special receiver portion 119, processor 129, AAPT software 166, AAPT table 167, LPF 110, SMPS 109, and conductors 145, 146 and 165. The triangle symbol may be considered to include driver amplifier 134, PA 106, as well as all other circuitry in the RF output signal path from the driver amplifier 134 to the input of PA 106.

Figure 19:
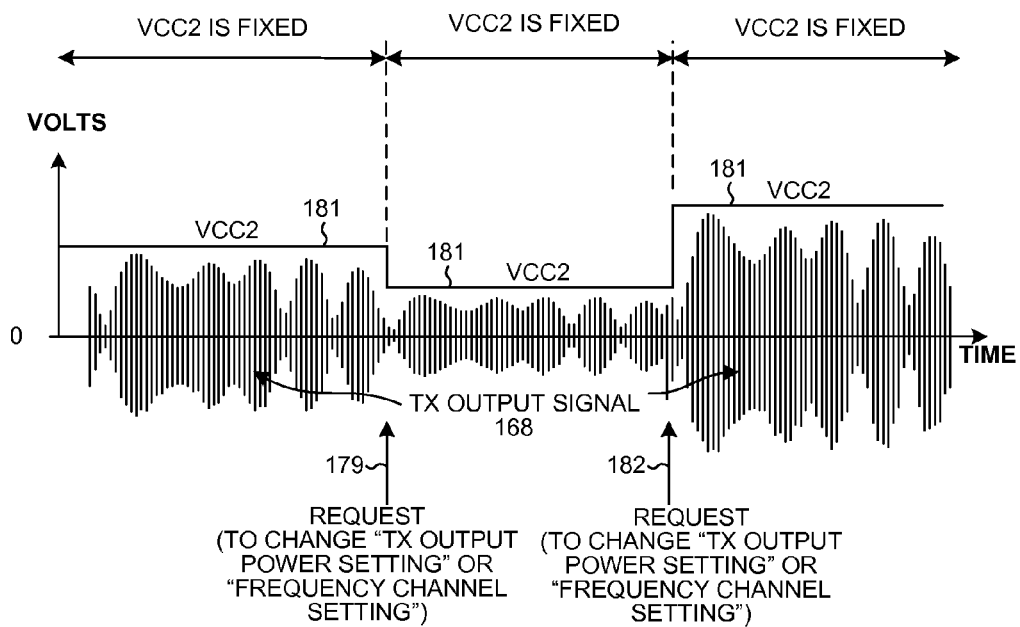
FIG. 19 is a waveform diagram that illustrates AAPT.

FIG. 19 is a simplified waveform diagram that illustrates operation of the AAPT method 300 of FIG. 17. Dark line 181 represents the supply voltage VCC2 supplied onto VCC2 terminal 144 of PA 106. As illustrated, the level of the VCC2 supply voltage changes in response to requests to change the "TX output power setting" or requests to change the "frequency channel". Arrow 179 represents a first request. This first request is the same request represented by an arrow symbol in FIG. 12. Arrow 182 represents a second request. The second request is the next request received. Once the new VCC2 setting is determined following one of these requests, the VCC2 setting is adjusted to be the new VCC2 setting. The VCC2 setting then remains unchanged until the next request. Accordingly, the VCC2 supply voltage also remains fixed until the next request. In one example, the level of VCC2 is changed at a rate of not more than approximately one change per millisecond.

Figure 7:
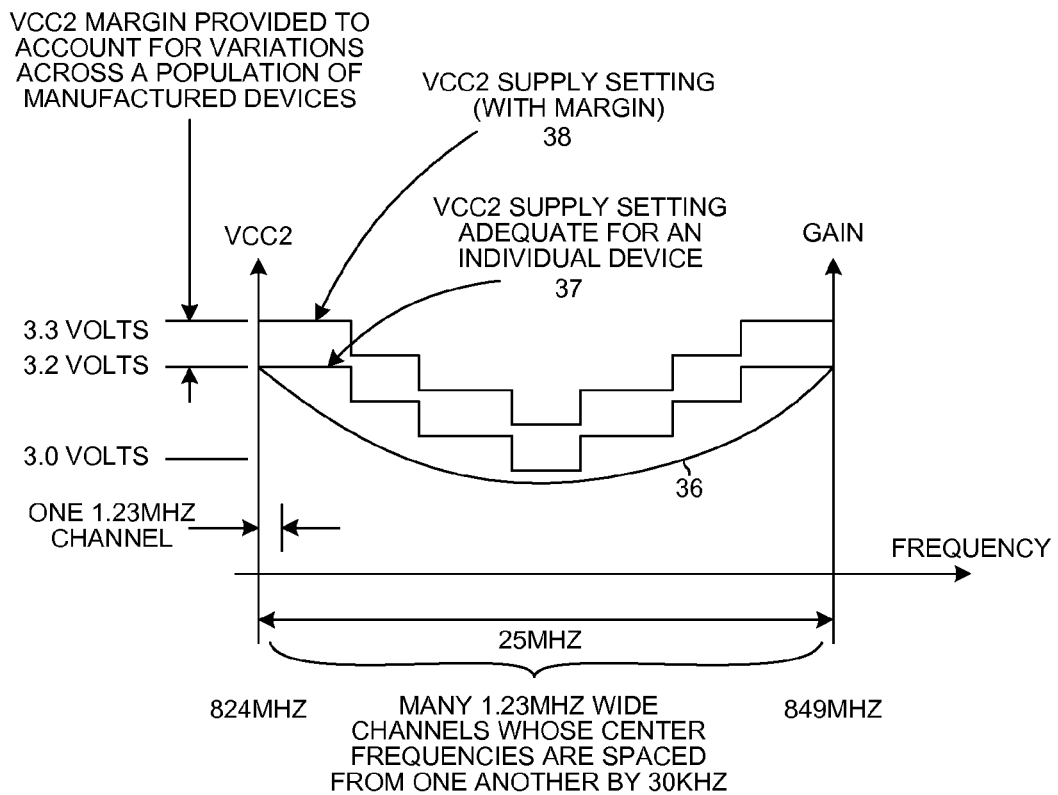
In FIG. 7 (Prior Art) is a diagram that shows how the PAs of all manufactured devices are supplied with a large VCC2 supply voltage even though individual devices may not require the large VCC2 supply voltage to meet MPS requirements.
Figure 8:
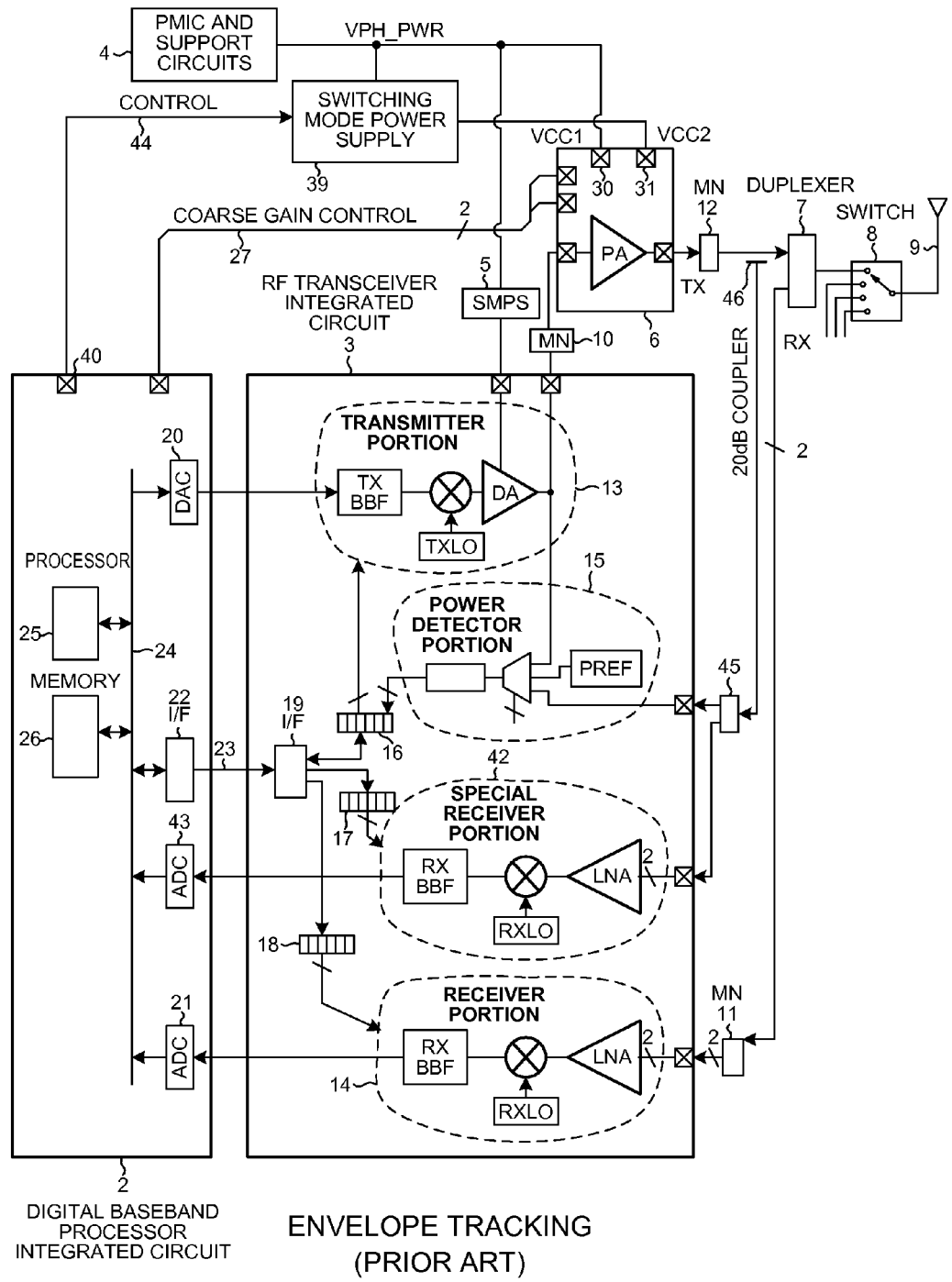
FIG. 8 (Prior Art) is a circuit diagram of a cellular telephone handset that employs "envelope tracking"
Figure 9:
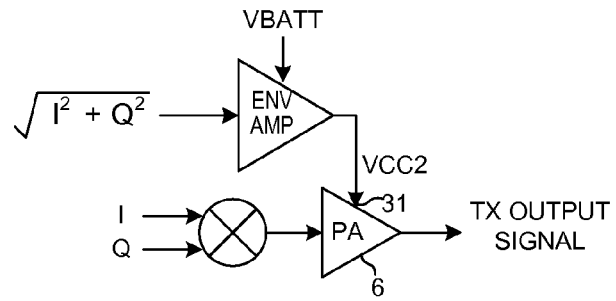
FIG. 9 (Prior Art) is a simplified diagram of the envelope tracking configuration of FIG. 8.
Figure 10:
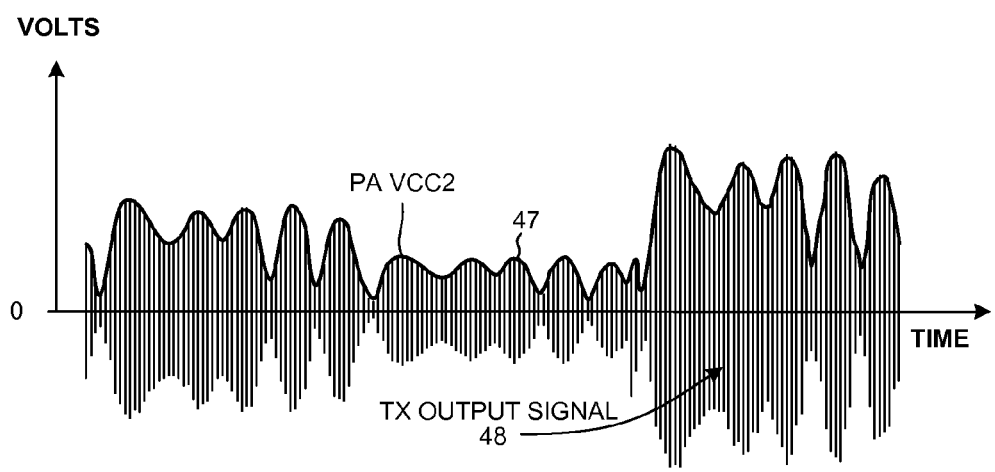
FIG. 10 (Prior Art) is a simplified diagram that illustrates operation of the envelope tracking operation carried out by the circuits of FIG. 8 and FIG. 9.
Figure 20:
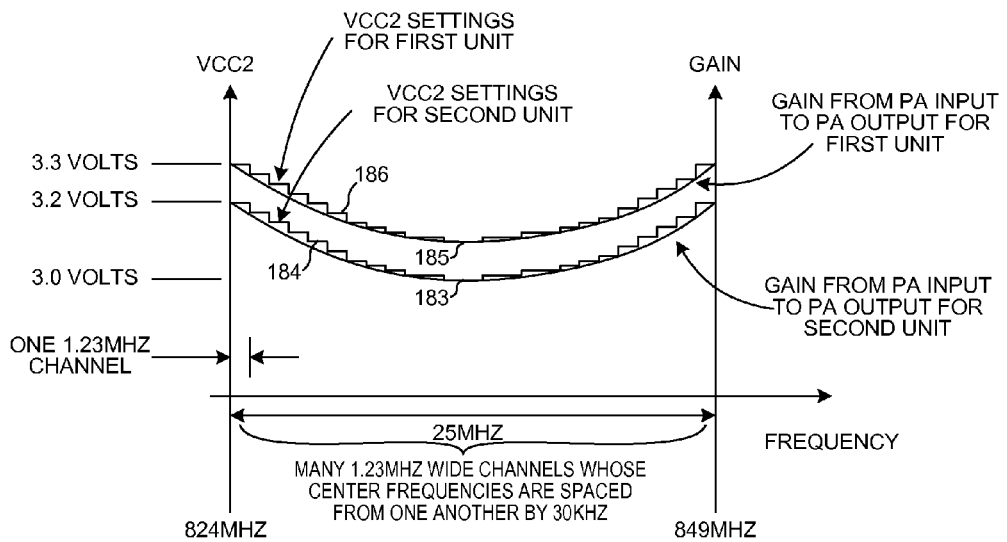
FIG. 20 is a diagram that illustrates how AAPT might be carried out on two different handset units.

FIG. 20 is a diagram that illustrates how the AAPT method 300 might be carried out on two different handset units. The diagram assumes a common TX output power setting is being used by both units. Drooping line 183 represents the PA power gain of a first handset unit for TX output signal frequencies ranging from 824 MHz to 849 MHz. The gain is made to be larger at the lower frequencies and at the higher frequencies to compensate for duplexer insertion loss that is higher at the lower and higher frequencies. Stair step line 184 represents how the VCC2 supply voltage supplied to the first handset unit is made to change as a function of TX output signal frequency. Drooping line 185 represents the PA power gain of a second handset unit over the same TX output signal frequency range. Stair step line 186 represents how the VCC2 supply voltage supplied to the second handset unit is made to change as a function of TX output signal frequency. Unlike the situation illustrated in FIG. 7, the two handset units are supplied with different VCC2 supply voltage levels even when the two handset units are transmitting at the same TX output signal frequency and with the same TX output signal power. The first handset can meet MPS/carrier linearity requirements using a lower VCC2 setting as compared to the second handset unit that requires a higher VCC2 setting to meet the same MPS/carrier linearity requirements. The PA of each handset unit manufactured does not need to be supplied with a high VCC2 supply voltage just so that a few poorly functioning devices in the population of manufactured devices will be MPS compliant. Advantageously, each individual handset unit is supplied with just enough VCC2 supply voltage to meet the MPS linearity requirement. The VCC2 level used on each handset unit is just barely high enough under handset operating conditions (for a given frequency channel and TX output power setting) to meet MPS requirements.

Figure 1:
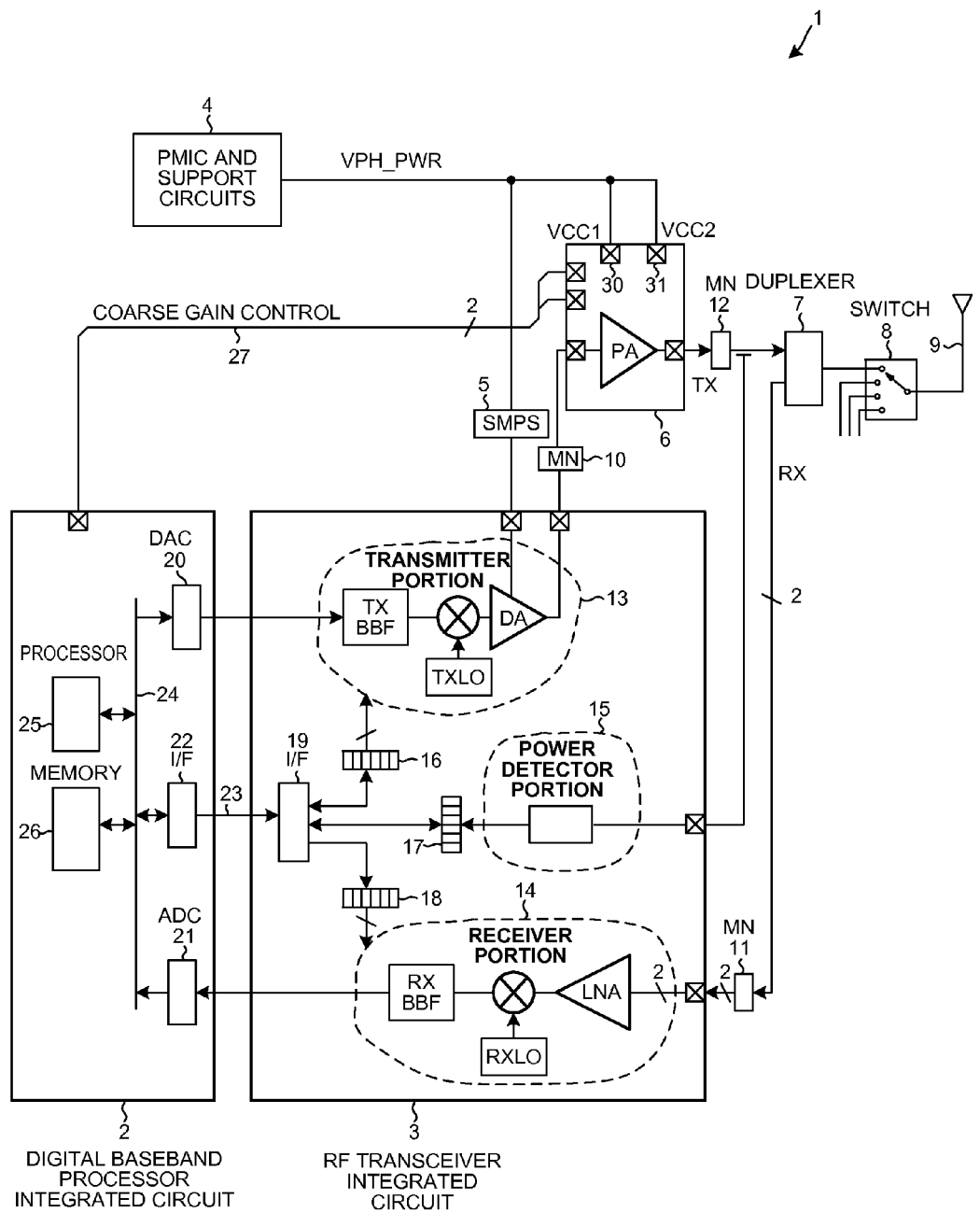
FIG. 1 (Prior Art) is a diagram of a cellular telephone handset that uses a battery direct configuration to power its power amplifier.
Figure 2:
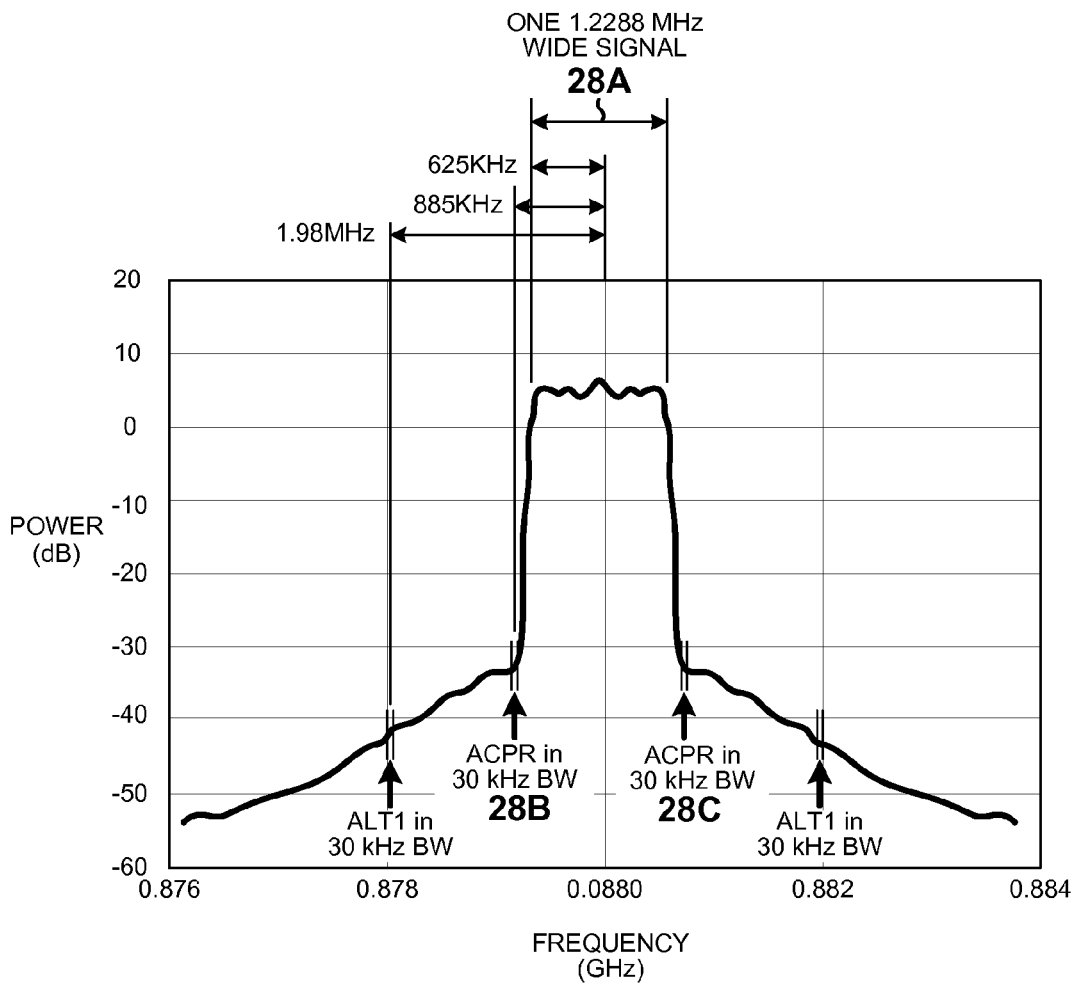
FIG. 2 (Prior Art) is a diagram that shows a characteristic of an RF signal as transmitted from the handset of FIG. 1.
Figure 3:
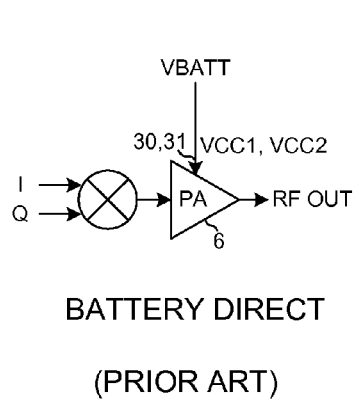
FIG. 3 (Prior Art) is a simplified diagram of the battery direct configuration circuit of FIG. 1.
Figure 4:
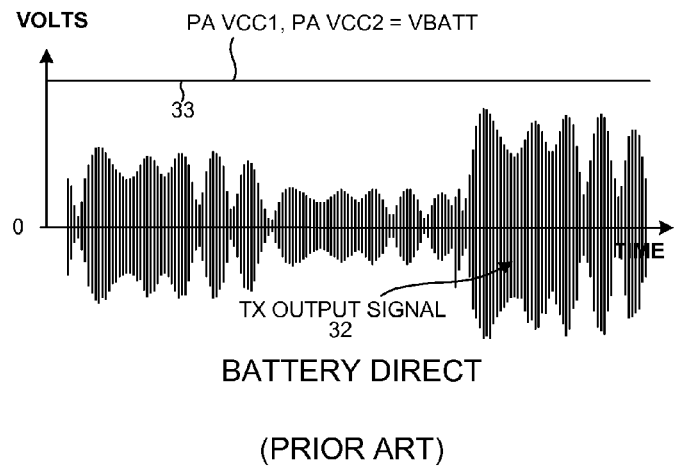
FIG. 4 (Prior Art) is a simplified waveform diagram that illustrates operation in the battery direct configuration.
Figure 5:
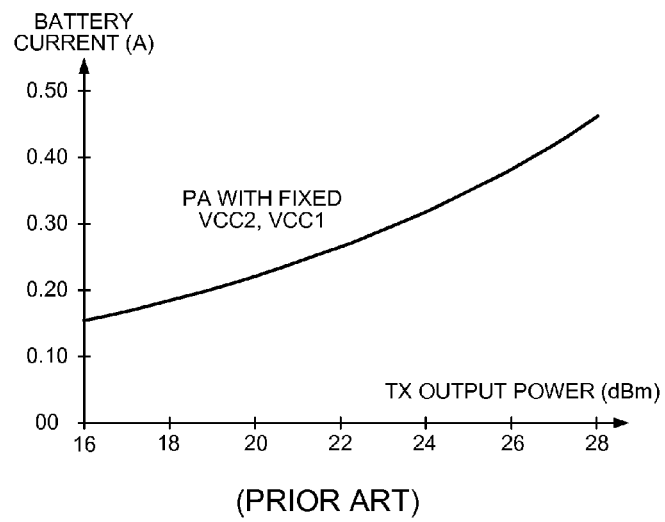
FIG. 5 (Prior Art) is a diagram that shows how changing VCC1 and VCC2 in the battery direct configuration affects TX output power and battery current drawn by the PA.
Figure 21:
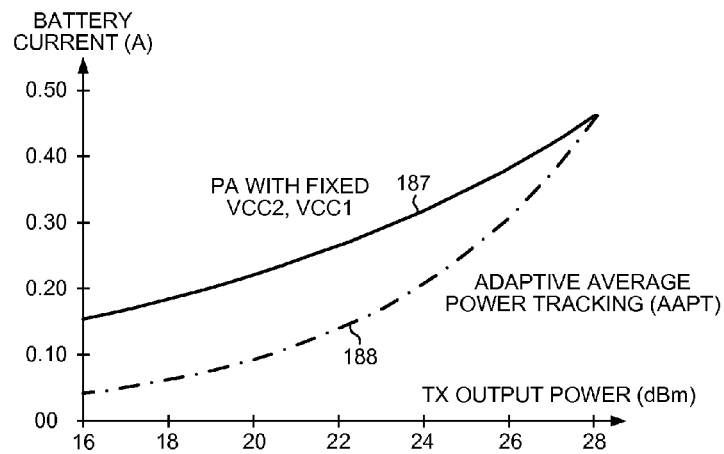
FIG. 21 is a is a simplified diagram that shows how battery current draw increases with increasing TX output power both in the example of the battery direct configuration of FIG. 1 and in the AAPT example of FIG. 17.

FIG. 21 is a simplified diagram that shows how handset battery current draw increases with increasing TX output power. Line 187 shows this relationship for a handset using the battery direct configuration set forth above in connection with FIG. 1. Line 188 shows this relation for the AAPT method 300 of FIG. 17.

Figure 22:
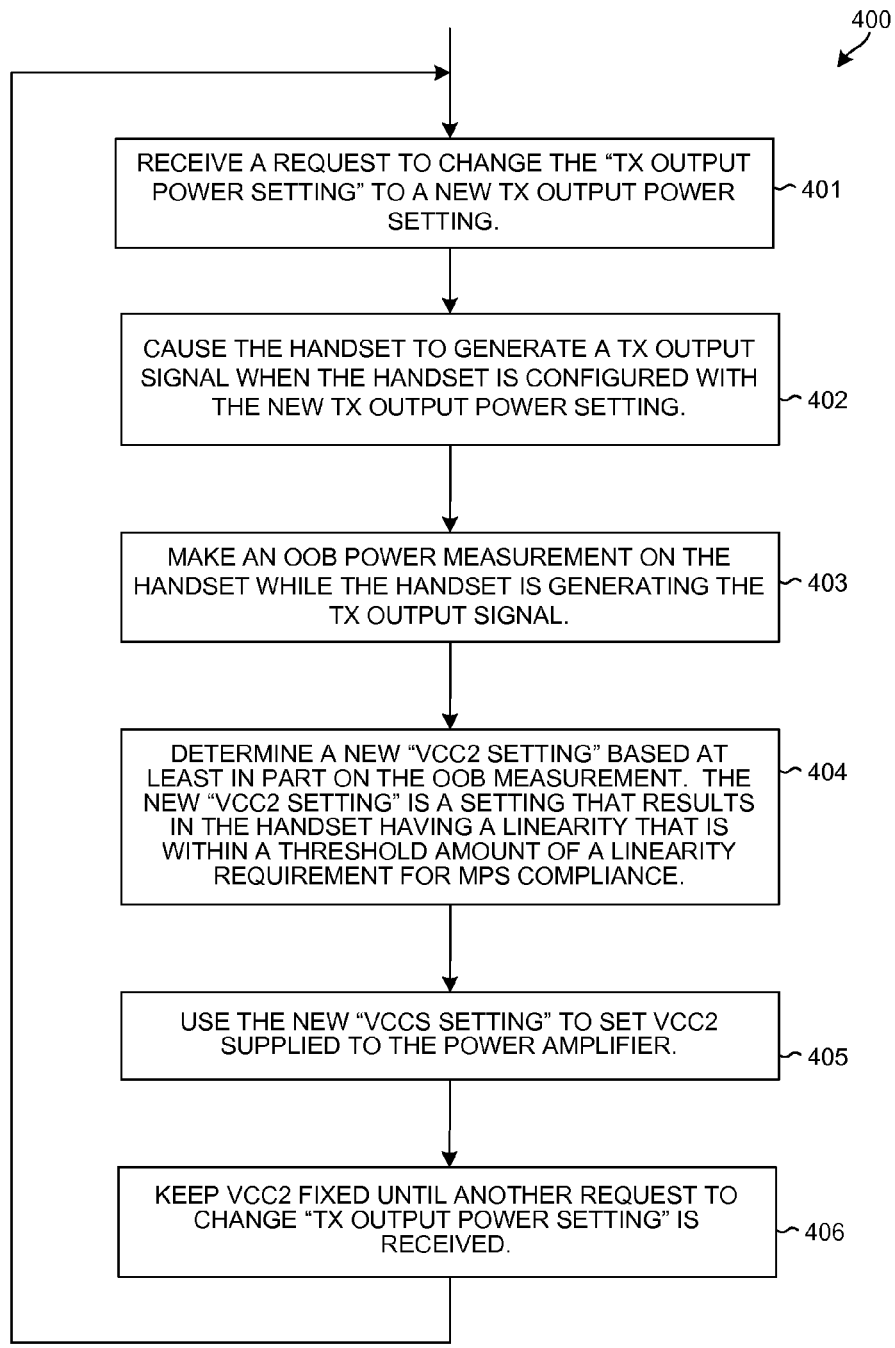
FIG. 22 is a flowchart of one particular flow through an AAPT method. In this particular flow, an Out-of-Band (OOB) measurement is taken and the result is used to determine a new VCC2 setting which in turn is used to update the AAPT table.

FIG. 22 is a flowchart of one particular flow through an AAPT method 400. A request is received (step 401) to change the "TX output power setting" being used by the handset 100. This request may be part of a wireless communication received onto the antenna 103 of the handset 100 that is performing the method. Alternatively, this request is a request generated by one part of the handset 100 and received by another part of the handset (for example, is an over-temperature trigger signal received by processor 129). The transmitter of the handset is then made to generate a TX output signal (step 402) using the requested new "TX output power setting". Circuitry on the handset (for example, special receiver portion 119) makes an OOB power measurement (step 403) when the handset is generating the TX output signal. The OOB power measurement measures power in a shoulder of the TX output signal. A new "VCC2 setting" that is based at least in part on the OOB power measurement is then determined (step 404). The new VCC2 setting is a setting that results in the handset 100 having a measured linearity that is within a threshold amount of a linearity requirement for MPS compliance. In one example, step 403 involves looping through steps 307, 308, 309, 310, 311, 313 and 314 of FIG. 17B until the new VCC2 setting is determined. One or more OOB power measurements may made during this looping. The measured linearity may be such that the measured linearity is not better than that set by the threshold in decision diamond 309 of FIG. 17B, and is such that the measured linearity is not worse than that set by the threshold in decision diamond 313 of FIG. 17B. Other ways of determining a new VCC2 setting that results in the handset having a performance characteristic that has a desired relationship with respect to performance requirement may be used in other examples of the method. Regardless of how the new VCC2 setting is determined, the new VCC2 setting is used (step 405) to set the VCC2 supply voltage supplied to the PA of the handset. Steps 402, 403, 404 and 405 occur in response to the receiving of the request in step 401. The VCC2 supply voltage then remains fixed (step 406) until another request to change the "TX output power setting" is received.

Figure 23:
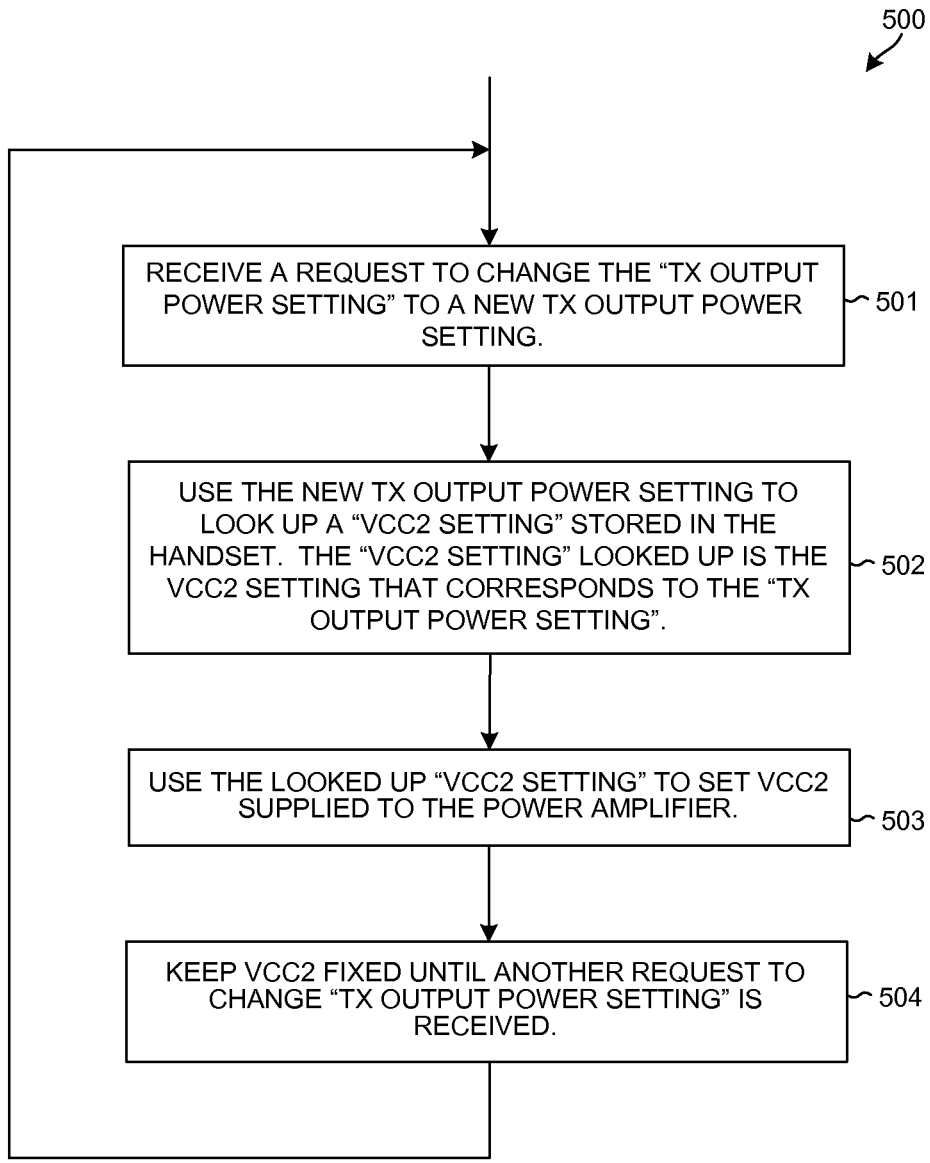
FIG. 23 is a flowchart of another particular flow through an AAPT method. In this particular flow, a new VCC2 setting is not determined by making an OOB measurement, but rather the requested TX output power setting is used to look up a previously stored VCC2 setting from the AAPT table and this looked up VCC2 setting is used until the next request is received.

FIG. 23 is a flowchart of another particular flow through an AAPT method 500. A request is received (step 501) to change the "TX output power setting" to a new TX output power setting. This request may be part of a wireless communication received onto the antenna 103 of the handset 100 that is performing the method. Alternatively, this request is a request generated by one part of the handset 100 and received by another part of the handset (for example, is an over-temperature trigger signal received by processor 129). The requested "TX output power setting" is then used (for example, in combination with the current "RF input power to PA setting") to look up (step 502) in the AAPT table 167 the "VCC2 setting" that corresponds to the requested "TX output power setting". The looked up "VCC2 setting" is then used (step 503) to set the VCC2 supply voltage supplied to the PA. Steps 502 and 503 occur in response to the receiving of the "TX output power setting" of step 501. Note that in this stepping through of steps of the AAPT method, that an OOB power measurement is not made and determinations of MPS compliance are not made. Rather, the requested new "TX output power setting" is merely used to look up an appropriate VCC2 setting from AAPT table 167 and then this looked up VCC2 setting is used to set the VCC2 supply voltage level supplied to the PA. The VCC2 supply voltage then remains fixed (step 504) until another request to change the "TX output power setting" is received.

Although examples of an AAPT method are described above that involve setting the VCC2 supply voltage such that measured linearity just barely meets MPS linearity requirements, the VCC2 supply voltage can be set using the AAPT method such that the handset exhibits another desired operational characteristic. In one example, the same AAPT method of FIG. 17 is carried out, except that the base station instructs the handset to change the thresholds used in steps 309 and 313. If the handset is operating in an environment where there are few other potentially interfering devices present, then the base station adjusts the thresholds in this way such that VCC2 is set to an even lower level where the handset outputs more spectral regrowth power than is actually allowed by MPS requirements. The base station therefore causes the handset to operate in a mode that is slightly non-compliant. Measured OOB power may, for example, be 3 dB greater than the maximum OOB power permitted for MPS compliance.

Depending on the TX output power setting and frequency channel setting, the handset may come into compliance and fall back out of compliance as it is used and as TX output power setting and frequency channel setting change. When the handset is determined to be back in an environment in which there are more other potentially interfering devices present, the base station instructs the handset to readjust the thresholds to bring the handset back into MPS compliance under all operating conditions.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. In one specific example, storage medium 130 is a memory in DBPIC 101. AAPT software 166 is a set of processor-executable instructions that are readable and executable by processor 129 of the DBPIC 101. Execution of this program 166 by processor 129 causes handset 100 to carry out the method 300 of FIG. 17.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method comprising:
   (a) receiving a request to change a transmitter (TX) output power setting of a mobile communication device to a new TX output power setting;
   (b) generating a transmitter (TX) output signal when the mobile communication device is configured with the new TX output power setting;
   (c) measuring an Out-Of-Band (OOB) power on the mobile communication device when the mobile communication device is generating the TX output signal;
   (d) determining a VCC2 setting based at least in part on the OOB power measuring;
   (e) using the determined VCC2 setting to set a VCC2 supply voltage supplied to a power amplifier; and
   (f) keeping the VCC2 supply voltage to substantially fixed until another request to change the TX output power setting is received.

2. The method of claim 1, wherein the request received in (a) is received onto the mobile communication device from a base station as part of a first wireless communication, and wherein said another request in (f) is received onto the mobile communication device as part of a second wireless communication.

3. The method of claim 1, wherein (a), (b), (c), (d), (e) and (f) are performed by the mobile communication device.

4. The method of claim 3, further comprising:
(g) generating the request in (a) in response to an over-temperature condition, wherein (g) occurs before the receiving of the request in (a), and wherein (g) is also performed by the mobile communication device.

5. The method of claim 1, wherein the VCC2 setting determined in (d) is a setting that results in the mobile communication device having a linearity that is within a predetermined threshold of a Minimum Performance Standards (MPS) linearity requirement.

6. The method of claim 1, wherein the VCC2 setting determined in (d) is a setting that results in the mobile communication device having a linearity that is approximately equal to a Minimum Performance Standards (MPS) linearity requirement.

7. The method of claim 1, wherein the VCC2 setting determined in (d) is a setting that results in the mobile communication device generating an amount of OOB power that is approximately equal to a maximum amount of OOB power allowed for Minimum Performance Standards (MPS) compliance.

8. The method of claim 1, wherein the VCC2 setting determined in (d) is a setting that results in the mobile communication device exhibiting a performance that has a predetermined relationship to respect to a Minimum Performance Standards (MPS) requirement.

9. The method of claim 1, further comprising:
(g) storing a plurality of VCC2 settings in the mobile communication device, wherein each VCC2 setting is stored in association with a corresponding TX output power setting.

10. The method of claim 1, further comprising:
(g) storing a plurality of VCC2 settings in the mobile communication device, wherein each VCC2 setting is stored in association with a corresponding TX output power setting, and wherein the VCC2 setting determined in (d) is stored in association with the new TX output power setting.

11. The method of claim 1, wherein the VCC2 setting determined in (d) is stored in association with the new TX output power setting, and wherein this storing occurs as a result of the receiving of the request in (a).

12. The method of claim 1, wherein (a), (b), (c), (d), (e) and (f) are performed by a digital baseband processor integrated circuit within the mobile communication device, wherein the using of (e) is a causing of a power supply circuit to supply the VCC2 supply voltage to the power amplifier, wherein the causing of (f) is a causing of the power supply circuit to continue to supply the VCC2 supply voltage to the power amplifier, and wherein the power supply circuit is not a part of the digital baseband processor integrated circuit.

13. The method of claim 1, wherein the power amplifier is a power amplifier integrated circuit, wherein the power amplifier integrated circuit has a first terminal that receives a VCC1 supply voltage, and wherein the power amplifier integrated circuit has a second terminal that receives the VCC2 supply voltage.

14. An apparatus, comprising:
a memory; and
means for: (a) receiving a request to change a transmitter (TX) output power setting to a new TX output power setting, (b) generating a transmitter (TX) output signal when the mobile communication device is configured with the new TX output power setting, (c) measuring an Out-Of-Band (OOB) power when the mobile communication device is generating the TX output signal, (d) determining a VCC2 setting based at least in part on the OOB power measurement, (e) using the determined VCC2 setting to set a VCC2 supply voltage supplied to a power amplifier, and (f) keeping the VCC2 supply voltage substantially fixed until another request to change the TX output power setting is received.

15. The apparatus of claim 14, wherein the apparatus is a digital baseband processor integrated circuit, wherein the memory stores a plurality of VCC2 settings, wherein each VCC2 setting is stored in association with a corresponding TX output power setting, and wherein the VCC2 setting determined by the means based at least in part on the OOB power measurement is a VCC2 setting stored in association with the new TX output power setting.

16. The apparatus of claim 15, further comprising:
means for storing the VCC2 setting that is determined based at least in part on the OOB power measurement on the apparatus in association with the new TX output power setting.

17. A method comprising:
(a) receiving a request to change a transmitter (TX) output power setting of a mobile communication device to a new TX output power setting;
(b) using the new TX output power setting to look up a VCC2 setting stored in the mobile communication device, wherein the VCC2 setting looked up corresponds to the new TX output power setting;
(c) using the looked up VCC2 setting to set a VCC2 supply voltage supplied to a power amplifier of the mobile communication device; and
(d) keeping the VCC2 supply voltage fixed until another request to change the TX output power setting is received.

18. The method of claim 17, wherein the mobile communication device stores a plurality of VCC2 settings, wherein each VCC2 setting stored is stored in association with a corresponding TX output power setting.

19. The method of claim 17, wherein each VCC2 setting stored is stored in association with a combination of a TX output power setting and a frequency channel setting.

20. A processor-readable medium storing a set of processor-executable instructions, wherein execution of the set of processor-executable instructions by a processor is for:
(a) in response to a receiving of a request to change a transmitter (TX) output power setting of a mobile communication device to a new TX output power setting, causing the mobile communication device to generate a transmitter (TX) output signal when the mobile communication device is configured with the new TX output power setting;
(b) measuring an Out-Of-Band (OOB) power on the mobile communication device when the mobile communication device is generating the TX output signal;
(c) determining a VCC2 setting based at least in part on the OOB power measurement;
(d) using the determined VCC2 setting to set a VCC2 supply voltage supplied to a power amplifier; and
(e) keeping the VCC2 supply voltage substantially fixed until another request to change the TX output power setting is received.

* * * * *